United States Patent [19]
Sutherland

[11] Patent Number: 5,742,182
[45] Date of Patent: Apr. 21, 1998

[54] SYMMETRIC SELECTOR CIRCUIT FOR EVENT LOGIC

[75] Inventor: Ivan E. Sutherland, Santa Monica, Calif.

[73] Assignee: Sun Microsystems, Inc., Mountain View, Calif.

[21] Appl. No.: 665,154

[22] Filed: Jun. 13, 1996

[51] Int. Cl.$^6$ .................................................. H03K 19/00
[52] U.S. Cl. ...................... 326/49; 326/21; 326/56; 327/415
[58] Field of Search ................... 326/21, 46, 49, 326/56, 57, 113; 327/215, 219, 415–416

[56] References Cited

U.S. PATENT DOCUMENTS

| | | | |
|---|---|---|---|
| 5,128,940 | 7/1992 | Wakimoto | 327/415 X |
| 5,420,529 | 5/1995 | Guay et al. | 326/115 |
| 5,497,118 | 3/1996 | Ueno et al. | 327/416 |
| 5,576,651 | 11/1996 | Phillips | 327/203 X |
| 5,640,117 | 6/1997 | Tanoi | 327/416 X |
| 5,652,724 | 7/1997 | Manning | 365/189.05 |

*Primary Examiner*—David R. Hudspeth
*Attorney, Agent, or Firm*—Townsend and Townsend and Crew LLP

[57] ABSTRACT

A selector circuit with symmetry is disclosed. It steers input transition events to one of two outputs according to the value of a data input signal. The selector circuit includes a first flip-flop and a second flip-flop. Depending on the state of a data input, one of the two flip-flops is enabled and the other is disabled. The disabled flip-flop will be in a tristate mode. The enabled flip-flop continues storing its data, and may load the disabled flip-flop with this data. The selector circuit further includes pass gates to couple the outputs of the flip-flops based on the state of the event input.

17 Claims, 1 Drawing Sheet

5,742,182

1

SYMMETRIC SELECTOR CIRCUIT FOR EVENT LOGIC

BACKGROUND OF THE INVENTION

This invention relates to logic circuits, and in particular to an improved selector circuit for use with event logic circuits.

One known technique for conveying information within computer systems is the concept of events. In the "transition signalling" convention, an event typically consists of a change in state of a signal. If a system uses a single conductor for transmission of events, the state of the conductor is changed to indicate an event. It is either raised or lowered from its previous condition. The resulting edge, rising or falling, denotes the occurrence of an event. For example, the conductor may be initially at a low potential, such as 0 volts. If a potential source then is switchably coupled to the conductor, the potential of the conductor changes to a different potential signalling an event. When the potential source is disconnected, the conductor returns to its 0 volt state, signalling another event. The rising edge, or the falling edge, both designate the occurrence of events.

In many digital systems selector circuits are used to steer an event from an input node to one of two (or more) output nodes depending upon the state of a control signal. For example, an event presented on an input terminal to a selector circuit can be steered to one of two output terminals for that selector circuit, depending upon the state of a binary control signal also supplied to the selector circuit. If the control signal is true, then the input event to the selector will cause an output event on one terminal, while if the control signal is false, then the input event will cause an output event on another terminal.

The general functionality of selector circuits is well known. For example, in prior work at Washington University, see *Macromodular Computer Design*, Part 1, Development of Macromodules, Vol. II, A Macromodule User's Manual, page 28; *Macromodular Computer Design*, Part 2, Manufacturing Description, Vol. V, Logic Drawings, page 204.10D3. These are both part of the Final Report—Feb. 1974 of Contract SD-302 between ARPA and Computer Systems Laboratory, Washington University, Saint Louis, Mo.

This invention provides an improved selector circuit, particularly useful for event logic circuits.

SUMMARY OF THE INVENTION

The present invention provides a high performance selector circuit. A selector circuit is a logic element used in digital systems, particularly those employing event logic. The present invention may be used in many types of digital circuits and systems, for example, computer systems or microprocessors.

The selector circuit of this invention provides for rapidly steering an event from a single input terminal to one of two output terminals depending on the binary value of a data signal controlling the selector. In operation, events are received at an event input terminal. A selection value, placed at a control terminal causes the selector circuit to steer the event to one of the output terminals. For each change of value at the event input, one or the other of the output nodes will change. Which output changes is determined by the selection value applied to the control terminal. The selector circuit of the present invention is symmetric because the circuit operates the same regardless of the state of the event input i.e., for rising or falling input events. Furthermore, the circuit of this invention is not sensitive to changes in the state of the selection value absent an event at the input terminal.

The selector circuit of the present invention includes two flip-flops, preferably identical. Depending on the state of the control terminal, one of the two flip-flops is enabled, and the other is disabled. The disabled flip-flop is placed in a tristate mode, that is, it presents a high impedance to its output terminals. The enabled flip-flop stores its data, and drives the disabled flip-flop with this data. The selector circuit further includes pass gates to couple the output terminals of the flip-flops together based on the state of the event input.

In accordance with this invention, a logic element is disclosed which includes a first flip-flop which is enabled in a first state and disabled in a second state. In the second state, the output of the first flip-flop output is tristated. The circuit also includes a second flip-flop which is disabled in the first state and enabled in the second state. In the first state, the output of the second flip-flop output is tristated. Data from the first flip-flop is passed to the second flip-flop in the first state, and data from the second flip-flop is passed to the first flip-flop in the second state.

The first flip-flop of the selector circuit may include a first flip-flop inverted output terminal and the second flip-flop may further include a second flip-flop inverted output. In the first state, the first flip-flop output is coupled to the second flip-flop output and the inverted output of the first flip-flop is coupled to the inverted output of the second flip-flop. In a second mode, the first flip-flop output is coupled to the second flip-flop inverted output and the first flip-flop inverted output is coupled to the second flip-flop output.

DESCRIPTION OF THE SPECIFIC EMBODIMENTS

Figure 1:
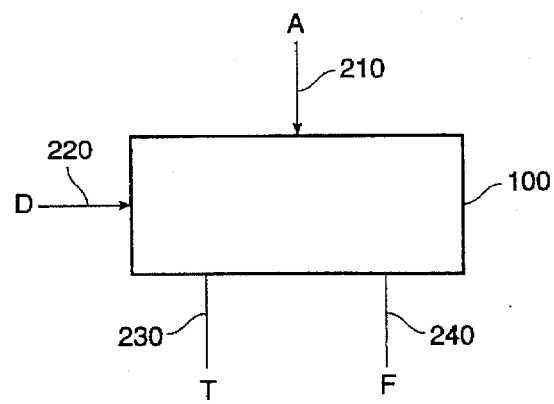
FIG. 1 is a block diagram of a selector circuit.

FIG. 1 is a block diagram of a selector circuit as may be embodied in a digital system, particularly a system employing event logic. Selector 100 is a circuit for steering an event from a single input terminal A to one of two or more output terminals T 230 and F 240, depending on the value of the control input signal D 220. In FIG. 1, if signal D 220 is true, an event or events on the input terminal A 210 cause an output event or events on output terminal T 230. If the control signal D 220 is false, events on terminal A 210 cause output events on terminal F 240. In other words, each input event is steered to one of two output terminals based on the control signal D.

Selector 100 has a bundling constraint. The data value, that is, the control input or information signal D 220, must be stable at the time the event arrives at event input terminal A 210. The data value must be stable to avoid an incomplete selection that would produce a partial change in one or the other or both of the output nodes. Therefore, we speak of the data value at node D 220 as "bundled" with the input event on A 210. This implies that an event on input node A 210 occurs only at times when the data value is stable. This "bundling" can be achieved by having the circuitry external to FIG. 2 designed to assure both the input event and a stable selector value are presented at the same time.

Figure 2:
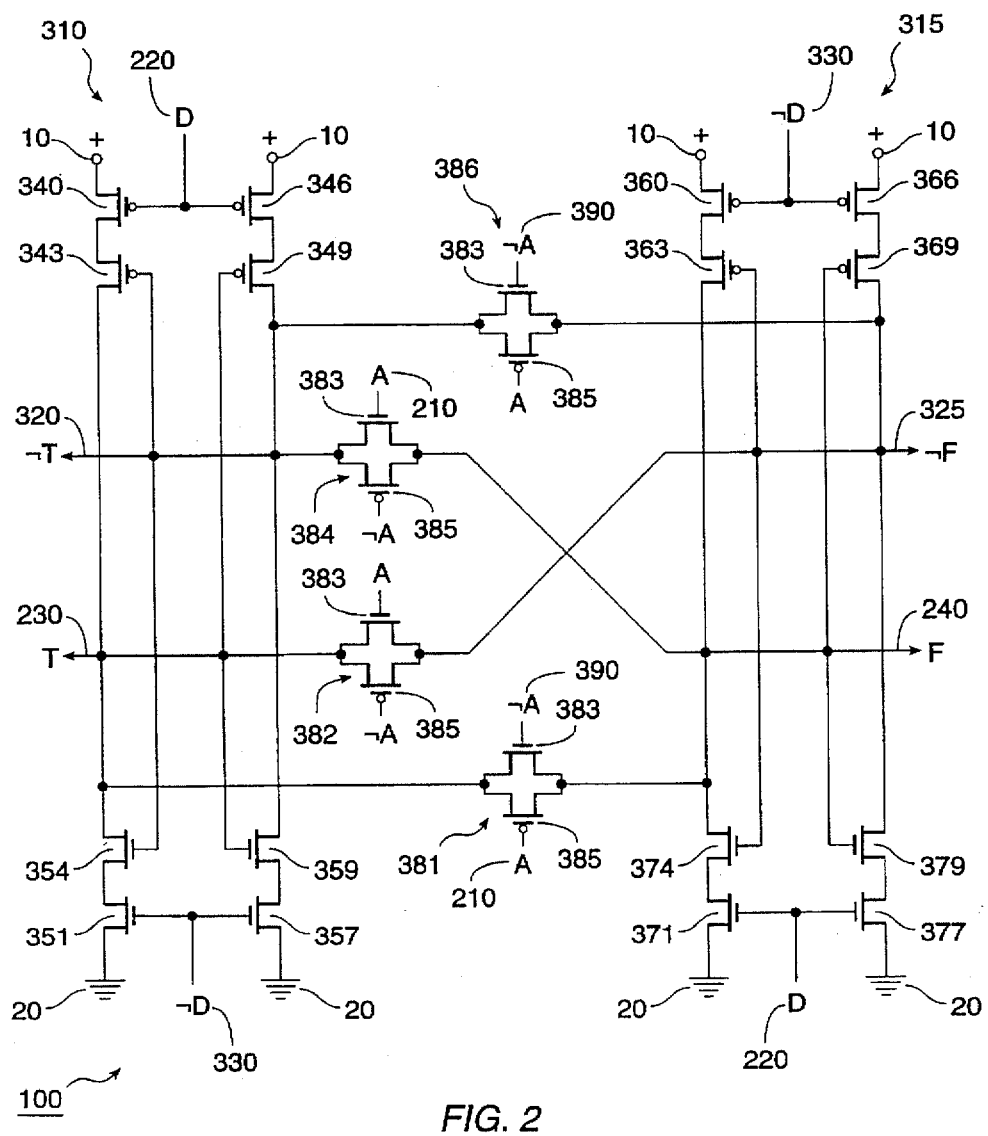
FIG. 2 is a schematic diagram for a selector circuit of the present invention.

FIG. 2 is a schematic of a preferred embodiment of the selector circuit 100 of the present invention. The circuit includes two flip-flops, a flip-flop 310, and a flip-flop 315. In this embodiment, flip-flops 310 and 315 are identical circuits. This accounts for some of the symmetry of selector circuit 100 of the present invention.

Flip-flop 310 drives output nodes T 230 and ⌐T 320 (the complement of T 230). Flip-flop 315 drives output nodes F 240 and ⌐F 325 (the complement off 240). During normal operation, depending on the state of signals D 220 and ⌐D 330 (the complement of D 220), one flip-flop is enabled (powered), while the other is disabled (not powered). In particular, when D 220 is a logic high, flip-flop 315 is enabled, while flip-flop 310 is disabled. When D 220 is a logic low, flip-flop 310 is enabled, white flip-flop 315 is disabled. When enabled, a flip-flop stores a logic state. When a flip-flop is disabled, its output terminals are tristated. New data, however, may be stored into a disabled flip-flop. This new data may come from the enabled flip-flop.

The upper part of flip-flop 310 is comprised of two parallel connected stacks of two serially connected PMOS transistors. One PMOS stack is coupled between a first potential supply 10 and node T 230. The first potential supply 10 is typically VDD (or VCC). VDD is generally about 5 volts, although 3.3 volts, as well as other voltages, are also possible. First supply 10 also may be a "local" VDD which is separate from VDD for the system. A PMOS transistor 340 in this stack is coupled between first supply 10 and the source of a PMOS transistor 343 in the stack. The gate of PMOS transistor 340 is coupled to node D 220. PMOS transistor 343, in series with PMOS transistor 340, is coupled between the drain of PMOS transistor 340 and node T 230. The gate of PMOS transistor 343 is coupled to node ⌐T 320.

Another PMOS stack is coupled between first potential supply 10 and node ⌐320. A PMOS transistor 346 in this stack is coupled between first supply 10 and the source of a PMOS transistor 349. The gate of PMOS transistor 346 is coupled to node D 220. A PMOS transistor 349, in series with PMOS transistor 346, is coupled between the drain of PMOS transistor 346 and node ⌐T 320. The gate of PMOS transistor 349 is coupled to node T 230.

Flip-flop 310 further includes two parallel stacks, each including two NMOS transistors coupled in series. One NMOS stack is coupled between node T 230 and a second potential supply 20. Second supply 20 is typically VSS or ground. VSS is generally taken to be zero volts. Second supply 20 may also be a "local" VSS which is separate from VSS for the system. An NMOS transistor 351 in this stack is coupled between the second potential supply 20 and the source of an NMOS transistor 354 in the stack. The gate of NMOS transistor 351 is coupled to node ⌐D 330. NMOS transistor 354, in series with NMOS transistor 351, is coupled between the drain of NMOS transistor 351 and node T 230. The gate of NMOS transistor 354 is coupled to node ⌐T 320.

Another stack of NMOS transistors is coupled between second supply 20 and node ⌐T 320. An NMOS transistor 357 in this stack is coupled between second supply 20 and the source of an NMOS transistor 359 in the stack. The gate of NMOS transistor 357 is coupled to node ⌐D 330. NMOS transistor 359, in series with NMOS transistor 357, is coupled between the drain of NMOS transistor 357 and node ⌐T 320. The gate of NMOS transistor 359 is coupled to node T 230.

Selector 100 further comprises flip-flop 315, which, in the preferred embodiment, is an identical circuit to flip-flop 310, except for the signal input nodes and output nodes.

Flip-flops 310 and 315 are coupled together using four pass gates 381, 382, 384 and 386. In the preferred embodiment, the four pass gates are identical. A first pass gate 381 couples node T 230 and node F 240 when node A 210 is logic low, otherwise first pass gate 381 isolates these nodes. A second pass gate 382 couples node T 230 and node ⌐F 325 when node A 210 is logic high, otherwise second pass gate 382 isolates these nodes. A third pass gate 384 couples node ⌐T 320 and node F 240 when node A 210 is logic high, otherwise third pass gate 381 isolates these nodes. A fourth pass gate 386 couples node ⌐T 320 and node ⌐325 when A 210 is logic low, otherwise fourth pass gate 381 isolates these nodes.

Each pass gate 381, 382, 384 and 386 may be designed using any well known technique. In the preferred embodiment of the present invention, the pass gates comprise CMOS transmission gates, where an NMOS transistor 383 is configured in parallel with a PMOS transistor 385. For purpose of explanation, each pass gate is shown as comprised of transistors 383 and 385. In the actual implementation of the circuit, each gate is formed from its own pair of transistors, not shared with other gates. For pass gate 381, the gate of NMOS transistor 383 is coupled to the ⌐A 390 input node (the complement of node A 210) and the gate of PMOS transistor 385 is coupled to node A 210. The other pass gates are similarly configured and connected as shown.

In operation, nodes D 220 and A 210 control how data is passed to nodes T 230 and F 240 of flip-flops 310 and 315. Node D 220 selects which output, node T 230 or node F 240, will be active. When node D 220 is logic high, node T 230 may change, while node F 240 will be fixed. More specifically, in this embodiment, when node D 220 is high, flip-flop 315 will remain coupled to first potential supply 10 and second supply 20, while flip-flop 310 will be decoupled from the potential supplies and thus able to change. Node T 230 and node ⌐F 320 will tristate. Then, flip-flop 310 may be loaded with data stored in powered flip-flop 315. The signal on node A 210, the input node, selects how output nodes T 230 and F 240 will be coupled to each other. In particular, when node A 210 is logic low, pass gates 381 and 386 couple node T 230 to node F 240 and node ⌐T 320 to node ⌐F 325. When node A 210 is logic high, pass gates 382 and 384 couple node T 230 to node ⌐F 325 and node ⌐T 320 to node F 240.

Similarly, when the signal on node D 220 is logic low, node T 230 is fixed, while node F 240 may change. More specifically in this embodiment, flip-flop 310 will remain coupled to first supply 10 and second supply 20, while flip-flop 315 will be decoupled from the potential supplies. Node F 240 and node ⌐F 325 will be tristated. Then, flip-flop 315 will be loaded with the data stored in powered flip-flop 310. Furthermore, when node A 210 is logic low, pass gates 381 and 386 couple node T 230 to node F 240, and node ⌐T 320 to node ⌐F 325. When node A 210 is logic high, pass gates 382 and 386 couple node T 230 to node ⌐F 325 and node ⌐T 320 to node F 240.

The foregoing description of preferred embodiments of the invention has been presented for the purposes of description. It is not intended to be exhaustive or to limit the invention to the precise form described, and modifications and variations are possible in light of the teaching above. For example, given the explanation above, it will be appreciated that selector circuits can be designed using the principles of this invention which select an input event to pass to any one of a group of output nodes in response to a multiple bit control signal.

What is claimed is:

1. A logic element comprising:

a first flip-flop having a first enabled state and a second disabled state, wherein in said second state, a first flip-flop output is placed in a tristate condition, the first flip-flop being coupled to a second flip-flop; and the second flip-flop having a first disabled state and a second enabled state, wherein in said first state, a second flip-flop output is placed in a tristate condition, wherein data from said first flip-flop is passed to said second flip-flop in said first state, and data from said second flip-flop is passed to said first flip-flop in said second state.

2. The logic element of claim 1 wherein in the first state, the first flip-flop is coupled to a first supply and a second supply, and said second flip-flop is decoupled from said first supply and said second supply.

3. The logic element of claim 1 wherein in said second state, said first flip-flop is decoupled from a first supply and a second supply, and said second flip-flop is coupled to said first supply and said second supply.

4. The logic element of claim 1 wherein said data from said first flip-flop is passed through at least one pass gate to said second flip-flop.

5. The logic element of claim 1 wherein said data from said second flip-flop is passed through a pass gate to said first flip-flop.

6. The logic element of claim 1 wherein said first flip-flop further includes a first flip-flop inverse output node and said second flip-flop further comprises a second flip-flop inverse output node, and wherein in a first mode said first flip-flop output node is coupled to said second flip-flop output node, and said first flip-flop inverse output node is coupled to said second flip-flop inverse output node, and in a second mode said first flip-flop output node is coupled to said second flip-flop inverse output node and said first flip-flop inverse output node is coupled to said second flip-flop output node.

7. The logic element of claim 1 wherein said first flip-flop has a circuit which is identical to said second flip-flop.

8. A selector circuit comprising:

a first flip-flop comprising a first output node and a second output node, said second output node providing a complementary output signal to the first output node;

a second flip-flop comprising a third output node and a fourth output node, said fourth output node providing a complementary output signal to the third output node;

a first pass gate for connecting the third output node to said first output node when a first control signal is in a first state and disconnecting the third output node from said first output node when aid first control signal is in a second state;

a second pass gate for connecting the third output node to said second output node when said first control signal is in said second state and disconnecting said third output node from said second output node when said first control signal is in said first state;

a third pass gate for connecting the third output node to said first output node when a first control signal is in a first state and disconnecting the third output node from said first output node when aid first control signal is in a second state; and a fourth pass gate for connecting the third output node to said second output node when said first control signal is in said second state and disconnecting said third output node from said second output node when said first control signal is in said first state.

9. The selector of claim 8 wherein when a second control signal is in said first state, said first flip-flop is in a powered state, and when said second control signal is in said second state, said first flip-flop is in an unpowered state, wherein in said powered state said first flip-flop stores a state of said first output and a state of said second output.

10. The selector of claim 9 wherein when a second control signal is in said second state, said second flip-flop is in a powered state, and when said second control signal is in said first state, said second flip-flop is in an unpowered state, wherein in said powered state said second flip-flop stores a state of said third output and a state of said fourth output.

11. The selector of claim 8 wherein when a second control signal is in a first state, said first flip-flop is coupled to a supply voltage and said second flip-flop is decoupled from said supply voltage, said first output of said first flip-flop drives said third output of said second flip-flop and said second output of said first flip-flop drives said fourth output of said second flip-flop.

12. The selector of claim 11 wherein when a second control signal is in a second state, said first flip-flop is decoupled from said supply voltage and said second flip-flop is coupled to said supply voltage, said third output of said second flip-flop drives said first output of said first flip-flop and said fourth output of said second flip-flop drives said second output of said first flip-flop.

13. A selector circuit comprising:

a first flip-flop, wherein said first flip-flop is coupled to a power supply in a first state and is decoupled from said power supply in a second state; and a second flip-flop, coupled through a pass gate to said first flip-flop, said second flip-flop is decoupled from said power supply in said first state and is coupled to said power supply in said second state.

14. The selector circuit of claim 13 wherein in said first state, said first flip-flop drives a first flip-flop output through said pass gate to said second flip-flop, and said second flip-flop stores said first flip-flop output.

15. The selector circuit of claim 14 wherein in said second state, said second flip-flop drives a second flip-flop output through said pass gate to said first flip-flop, and said first flip-flop stores said second flip-flop output.

16. The selector circuit of claim 13 wherein in said first state, said second flip-flop is in a tristate mode.

17. The selector circuit of claim 13 where in said second state, said first flip-flop is in a tristate mode.

* * * * *